(12) United States Patent (10) Patent No.: US 9,063,430 B2
Kumagai et al. (45) Date of Patent: Jun. 23, 2015

(54) COATING AGENT FOR FORMING FINE PATTERN

(71) Applicant: Tokyo Ohka Kogyo Co., Ltd., Kawasaki (JP)

(72) Inventors: Tomoya Kumagai, Kawasaki (JP); Takumi Namiki, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 14/326,910

(22) Filed: Jul. 9, 2014

(65) Prior Publication Data

US 2015/0017590 A1 Jan. 15, 2015

(30) Foreign Application Priority Data

Jul. 12, 2013 (JP) ................................. 2013-146967

(51) Int. Cl.
*G03F 7/26* (2006.01)
*G03F 7/40* (2006.01)
*C09D 129/04* (2006.01)

(52) U.S. Cl.
CPC ................ *G03F 7/40* (2013.01); *C09D 129/04* (2013.01)

(58) Field of Classification Search
CPC ....... G03F 7/00; G03F 7/0035; H01L 21/0337; H01L 21/0338; H01L 21/28132; H01L 21/3088; H01L 21/32139; C06K 2211/1029; C06K 2211/1466; C08G 61/12; C08G 2261/1644
USPC ........................................... 430/314, 313, 330
See application file for complete search history.

(56) References Cited

U.S. PATENT DOCUMENTS

2010/0090372 A1  4/2010  Ishikawa et al.

FOREIGN PATENT DOCUMENTS

JP  2008-180813  8/2008

*Primary Examiner* — Caleen Sullivan
(74) *Attorney, Agent, or Firm* — Knobbe Martens Olson & Bear LLP

(57) ABSTRACT

A coating agent for forming a fine pattern and a method for forming a fine pattern using the coating agent, in which the coating agent allows a resist pattern to be favorably fined, and can form a fined pattern having a suppressed deviation of CD. A coating agent for forming a fine pattern including (A) a water-soluble polymer is combined with a compound in which the compound has an alkyl group having 8 or more carbon atoms bound to a nitrogen atom, and is combined with 4 moles or more of ethylene oxide and/or propylene oxide with respect to 1 mole of a nitrogen atom bound with the alkyl group as (B) a nitrogen-containing compound.

7 Claims, 6 Drawing Sheets

COATING AGENT FOR FORMING FINE PATTERN

CROSS-REFERENCE TO RELATED APPLICATIONS

This application claims priority under 35 U.S.C. §119(a)-(e) to Japanese Patent Application No. 2013-146967, filed Jul. 12, 2013, the entire content of which is incorporated herein by reference.

BACKGROUND OF THE INVENTION

1. Field of the Invention

The present invention relates to a coating agent for forming a fine pattern which is used for forming a fine resist pattern, and a method for forming a fine pattern which forms a fine resist pattern using the coating agent for forming a fine pattern.

2. Related Art

In the production of electronic components, such as semiconductor devices and liquid crystal devices, photolithographic techniques have been used when a process such as etching is performed on a substrate. In the photolithographic techniques, a coat film (resist layer) is formed on a substrate using a so-called photoresist material responsive to actinic radiation, then the resist layer is selectively irradiated with the actinic radiation in order to perform light exposure, and thereafter a developing treatment is performed to selectively dissolve and remove the resist layer so as to form an image pattern (resist pattern) on the substrate. Then, a wiring pattern is formed on the substrate by carrying out an etching process with this resist pattern as a protective layer (mask pattern).

In unison with a recent growing tendency to highly integrate and miniaturize semiconductor devices, fine-fabrication in the formation of these resist patterns has also advanced and thus ultra-fine-processing is required. In addition to attempt to achieve such ultra-fine-fabrication of the resist pattern, research and development of techniques have been performed in order for the pattern fine-fabrication to exceed the resolution limit of the resist materials also in view of pattern formation methods.

As a method for forming an ultra-fine resist pattern, for example, a method is known for obtaining an ultra-fine resist pattern by forming a coat film composed of a coating agent for forming a fine pattern including a water-soluble polymer on the surface of a resist pattern formed on a substrate, followed by thermal-shrinking the formed coat film to narrow down the intervals of the resist pattern.

In detail, for example, a coating agent for forming a fine pattern has been proposed, which includes (A) a water-soluble polymer, and (B) at least one selected from quaternary ammonium hydroxide, alicyclic ammonium hydroxide, and morpholinium hydroxide (Patent Document 1).

[Patent Document 1] Japanese Unexamined Patent Application, Publication No. 2008-180813

SUMMARY OF THE INVENTION

According to the coating agent for forming a fine pattern disclosed in Patent Document 1, a resist pattern can be uniformly fined. However, before a pattern is fined, there are deviations of pattern critical dimension (CD) in some cases due to deviations in the exposure amount, baking, and mask critical dimension. For this reason, in case of forming a fine resist pattern using the coating agent for forming a fine pattern disclosed in Patent Document 1, there is a problem in that since the fine resist pattern having a deviation of CD is uniformly formed, a deviation in the CD of the fined pattern also occurs due to the deviation in CD of the pattern before being fined.

The present invention was made in view of the foregoing problems, and an object of the invention is to provide a coating agent for forming a fine pattern and a method for forming a fine pattern using the coating agent for forming a fine pattern, in which a resist pattern can be favorably fined and a fine pattern having a suppressed deviation of CD can be formed.

The present inventors have found that the problems described above can be solved by way of combining (A) a coating agent for a fine pattern including a water-soluble polymer and (B) a compound that has an alkyl group having 8 or more carbon atoms bound to a nitrogen atom, and is combined with 4 moles or more of ethylene oxide and/or propylene oxide with respect to 1 mole of the nitrogen atom bound with the alkyl group, as a nitrogen-containing compound, thereby completing the present invention.

A first aspect of the present invention provides, for a coating agent for forming a fine pattern, used for coating a resist pattern formed on a substrate and forming a fine pattern, the coating agent for forming a fine pattern, which includes (A) a water-soluble polymer and (B) a nitrogen-containing compound, in which (B) the nitrogen-containing compound has an alkyl group having 8 or more carbon atoms bound to a nitrogen atom, and is combined with 4 moles or more of ethylene oxide and/or propylene oxide with respect to 1 mole of the nitrogen atom bound with the alkyl group.

A second aspect of the present invention provides a method for forming a fine pattern, in which the method includes coating a resist pattern on a substrate with a coat film composed of the coating agent for forming a fine pattern according to the first aspect, performing thermal-shrinking of the coating agent for forming a fine pattern through a heating treatment to narrow down the intervals of the resist patterns, and then removing the coat film.

According to the present invention, a coating agent which can form a favorably fined pattern having a suppressed deviation of CD and a method for forming a fine pattern using the coating agent for forming a fine pattern can be provided.

DETAILED DESCRIPTION OF THE INVENTION

Coating Agent for Forming Fine Pattern

Figure 1:
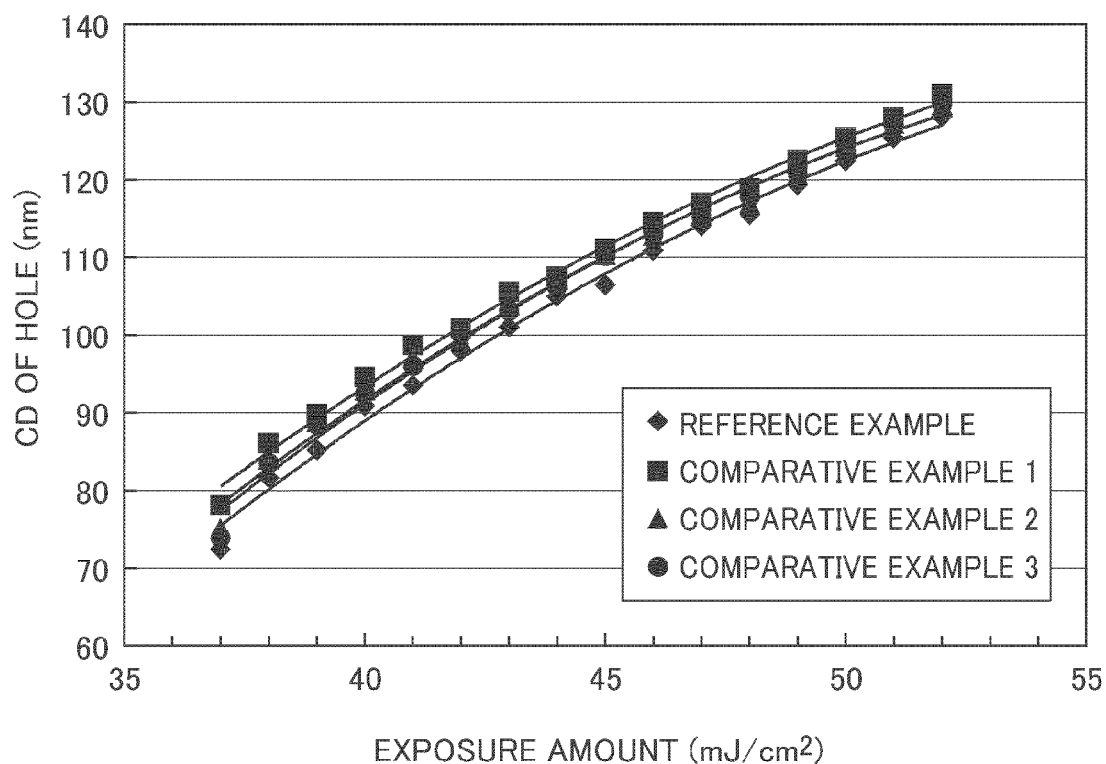
FIG. 1 shows a graph illustrating the relationship between the exposure amount and the CD of a hole in case of treating a hole pattern using the coating agents of Reference Example and Comparative Examples 1 to 3.

A coating agent for forming a fine pattern (hereinafter, referred to as a coating agent) according to the present invention includes (A) a water-soluble polymer and (B) a nitrogen-containing compound of a predetermined structure. The coating agent for forming a fine pattern is generally used in a state of solution, and thus, may include (S) a solvent. In addition, a coating agent for forming a fine pattern may include various components that are included in the conventional coating agent for forming a fine pattern within the range that does not hinder the object of the present invention. Hereinafter, essential and optional components included in the coating agent for forming a fine pattern will be described.

(A) Water-Soluble Polymer

The type of the water-soluble polymer is not particularly limited as long as the water-soluble polymer can be dissolved in a solvent at a concentration capable of forming a coating film having the desired film thickness, and does not gel when being dissolved in a solvent.

A preferable example of a water-soluble polymer may include at least one selected from a polymer of one or more acrylic-based monomers, a polymer of one or more vinyl-based monomers, a copolymer of acrylic-based monomers and vinyl-based monomers, a cellulose-based resin, an amide-based resin, and a water-soluble peptide.

Examples of the acrylic-based monomer may include acrylic acid, methyl acrylate, methacrylic acid, methyl methacrylate, N,N-dimethylacrylamide, N,N-dimethylaminopropylmethacrylamide, N,N-dimethylaminopropylacrylamide, N-methylacrylamide, diacetoneacrylamide, N,N-dimethylaminoethyl methacrylate, N,N-diethylaminoethyl methacrylate, N,N-dimethylaminoethyl acrylate, acryloyl morpholine, and the like.

Examples of the vinyl-based resin may include N-vinylpyrrolidone, vinylimidazolidinone, vinyl acetate, allyl amine, and the like.

In the case when a polymer of vinyl-based monomers or a copolymer of acrylic-based monomers and vinyl-based monomers has a constituent unit derived from vinyl acetate, an ester group of such a constituent unit may be hydrolyzed to be a vinyl alcohol unit. In addition, a hydroxyl group of such a vinyl alcohol unit may be protected by acetal, and the like.

Examples of the cellulose-based resin may include hydroxypropyl methylcellulose phthalate, hydroxypropyl methylcellulose acetate phthalate, hydroxypropyl methylcellulose hexahydrophthalate, hydroxypropyl methylcellulose acetate succinate, hydroxypropyl methylcellulose, hydroxypropyl cellulose, hydroxyethyl cellulose, cellulose acetate hexahydrophthalate, carboxymethyl cellulose, ethyl cellulose, methyl cellulose, and the like.

Furthermore, among amide-based resins, those which are soluble in water can be also used.

Of these examples, vinyl-based resins are preferred, and particularly polyvinylpyrrolidone and polyvinyl alcohol are preferred.

The mass average molecular weight of a polymer of one or more acrylic-based monomers, a polymer of one or more vinyl-based monomers, a copolymer of acrylic-based monomers and vinyl-based monomers, a cellulose-based resin, or an amide-based resin is preferably 500 or more and 20000 or less and more preferably 1000 or more and 5000 or less.

The water-soluble peptide is not particularly limited as long as it has high solubility in water at room temperature and does not easily gel even at a low temperature. The mass average molecular weight of the water-soluble peptide is preferably 10000 or less and more preferably 5000 or less. When the mass average molecular weight thereof is 10000 or less, it has high solubility in water and gels with difficulty even at a low temperature, and thus, the stability of the solution becomes higher. In addition, the lower limit of the mass average molecular weight is preferably 500 or more. In addition, the water-soluble peptide may be derived from a natural substance or may be a synthetic product. Furthermore, it may be a derivative of a water-soluble peptide.

Examples of the water-soluble peptide may include a hydrolyzed peptide derived from collagen, a hydrolyzed peptide derived from a silk protein, a hydrolyzed peptide derived from a soy protein, a hydrolyzed peptide derived from a wheat protein, a hydrolyzed peptide derived from a rice protein, a hydrolyzed peptide derived from a sesame protein, a hydrolyzed peptide derived from a pea protein, a hydrolyzed peptide derived from a wool protein, a hydrolyzed peptide derived from casein, and the like.

These water-soluble polymers may be used singly or in a combination of two or more. For the coating agent, the amount of the water-soluble resin used is not particularly limited, but is appropriately determined in view of the film thickness of the coating film to be formed and the viscosity of a coating agent. For the coating agent, the content of the water-soluble resin is preferably 0.1 to 20% by mass, more preferably 0.5 to 10% by mass, and particularly preferably 1 to 5% by mass with respect to 100% by mass of the total mass of the coating agent for forming a fine pattern.

(B) Nitrogen-Containing Compound

The coating agent includes (B) a nitrogen-containing compound having a specific structure.

(B) The nitrogen-containing compound has an alkyl group having 8 or more carbon atoms bound to a nitrogen atom, and is combined with 4 moles or more of ethylene oxide and/or propylene oxide with respect to one mole of nitrogen atom bound with the alkyl group. The number of nitrogen atoms included in (B) the nitrogen-containing compound is not particularly limited as long as (B) the nitrogen-containing compound has a predetermined structure, but generally, it is preferable to be 1.

(B) The nitrogen-containing compound having such a structure has a surfactant-like property by having an oxyethylene unit, an oxypropylene unit, and a long-chain alkyl group. Therefore, in the case of using the coating agent according to the present invention, it is deemed that (B) the nitrogen-containing compound is easily and favorably adsorbed onto the surface of the resist pattern and (B) the nitrogen-containing compound adsorbed onto the surface of the resist pattern allows the glass transition point (Tg) of the surface layer of the resist pattern to be decreased by a surfactant-like function. By decreasing Tg, it is easy to shrink the pattern further.

In addition, it is deemed that (B) a nitrogen-containing compound allows the surface of a resist pattern to be partially dissolved, in which the surface of the resist pattern is insufficiently de-protected and is not dissolved with a developing treatment, when being favorably adsorbed on the surface of the resist pattern based on a basic property thereof. Therefore, when a fine pattern is formed by using the coating agent according to the present invention, it is deemed that the surface of the resist pattern is smoothed, and for example, when the resist pattern is a hole pattern, the circularity of a hole (modifications or deformations of the hole shape are minor, and the shape of a hole is nearly circular) becomes higher. In addition, CD uniformity is also improved after being shrunk by decreasing deviation of CD before being shrunk by the smoothing of the surface of the pattern.

As (B) the nitrogen-containing compound, a compound represented by the following Formula (1) or the following Formula (2) is preferable.

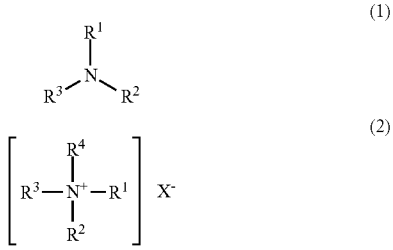

(1)

(2)

(In Formula (1), $R^1$ represents an alkyl group having 8 or more carbon atoms, $R^2$ represents a group represented by $-(A-O)_q—R^5$, and $R^3$ represents a hydrogen atom, an alkyl group, a hydroxyalkyl group, or a group represented by $-(A-O)_r—R^5$. In Formula (2), $R^1$ and $R^2$ are the same as in Formula (1), $R^3$ represents an alkyl group, a hydroxyalkyl group, or a group represented by $-(A-O)_r—R^5$, $R^4$ represents an alkyl group, a hydroxyalkyl group, or a group represented by $-(A-O)_s—R^5$, and $X^-$ represents a monovalent anion. A represents an ethylene group or a propylene group, $R^5$ represents a hydrogen atom or an alkyl group, q represents a positive number, r and s each represent 0 or a positive number, and q+r+s represents 4 or more.)

For the compounds represented by Formula (1) and Formula (2), $R^1$ preferably represents an alkyl group having 8 or more carbon atoms, and more preferably an alkyl group having 12 or more carbon atoms. As $R^1$, the number of carbon atoms of the alkyl group is preferably 20 or less. As $R^1$, the structure of the alkyl group is not particularly limited, but may be in the form of a linear chain or in the form of a branched chain.

As $R^1$, a preferable specific example of the alkyl group may include an n-octyl group, an octane-2-yl group, an octane-3-yl group, a 2-ethylhexyl group, a 5-methyl-heptyl group, an n-nonyl group, a nonane-2-yl group, a nonane-3-yl group, an n-decyl group, an isodecyl group, a decan-2-yl group, a decan-3-yl group, a 7,7-dimethyl octyl group, an n-undecyl group, an undecan-2-yl group, an undecan-3-yl group, an n-dodecyl group, a dodecan-2-yl group, a dodecan-3-yl group, a dodecan-4-yl group, an n-tridecyl group, a tridecan-2-yl group, an n-tetradecyl group, a tetradecan-2-yl group, an n-pentadecyl group, an n-hexadecyl group, a hexadecan-2-yl group, an n-heptadecyl group, an n-octadecyl group, an octadecan-2-yl group, an n-nonadecyl group, an n-icosyl group and an icosan-2-yl group.

For $-(A-O)_q—R^5$, $-(A-O)_r—R^5$, and $-(A-O)_s—R^5$ that are the groups included in the compounds represented by Formula (1) and Formula (2), q, r, and s represent the average addition numbers of ethylene oxide and/or propylene oxide to a nitrogen atom, respectively, and in some cases, they may not be integers.

For $-(A-O)_q—R^5$, $-(A-O)_r—R^5$, and $-(A-O)_s—R^5$ that are the groups included in the compounds represented by Formula (1) and Formula (2), $R^5$ represents a hydrogen atom or an alkyl group, and preferably, a hydrogen atom. In the case when $R^5$ represents an alkyl group, the number of the carbon atoms is preferably 1 to 6, and more preferably 1 to 4. In the case when $R^5$ represents an alkyl group, a specific example may include a methyl group, an ethyl group, an n-propyl group, an isopropyl group, an n-butyl group, an n-pentyl group, and an n-hexyl group.

For the compound represented by Formula (1), it is preferable that $R^2$ represent the group represented by $-(A-O)_q—H$ and $R^3$ represent the group represented by $-(A-O)_r—H$. For the compound represented by Formula (2), it is preferable that $R^2$ represent the group represented by $-(A-O)_q—H$, $R^3$ represent the group represented by $-(A-O)_r—H$, and $R^4$ represent the group represented by $-(A-O)_s—H$.

For Formula (1) and Formula (2), the value of q+r+s is 4 or more, preferably 4 to 25, and more preferably 4 to 20. As (B) a nitrogen-containing compound, in order for the value of q+r+s to be within the above range, the compound that is added with ethylene oxide and/or propylene oxide to a nitrogen atom is combined with a coating agent, and thereby, a resist pattern can be favorably fined and also the deviation of CD for the fined pattern can be suppressed at the same time.

For Formula (1) and Formula (2), in the case when $R^3$ or $R^4$ represents an alkyl group or a hydroxyalkyl group, the numbers of the carbon atoms of the alkyl group and hydroxyalkyl group are not particularly limited, but preferably are 1 to 8, and more preferably 1 to 6. In the case when $R^3$ or $R^4$ represents an alkyl group, a specific example may include a methyl group, an ethyl group, an n-propyl group, an isopropyl group, an n-butyl group, an isobutyl group, a sec-butyl group, a tert-butyl group, an n-pentyl group, an n-hexyl group, an n-heptyl group, and an n-octyl group. In the case when $R^3$ or $R^4$ represents a hydroxyalkyl group, a specific example may include a hydroxymethyl group, a 2-hydroxyethyl group, a 3-hydroxy-n-propyl group, a 4-hydroxy-n-butyl group, a 5-hydroxy-n-pentyl group, a 6-hydroxy-n-hexyl group, a 7-hydroxy-n-heptyl group, and an 8-hydroxy-n-octyl group.

In Formula (2), $X^-$ is not particularly limited in the range that does not hinder the objects of the present invention. $X^-$ is preferably a halide ion, such as a hydroxide ion, a chloride ion, a bromide ion, and an iodide ion, and more preferably a hydroxide ion.

A preferable example of the compound represented by Formula (1) may be as follows. For the following formula, m and n represent positive numbers and m+n represents 4 or more.

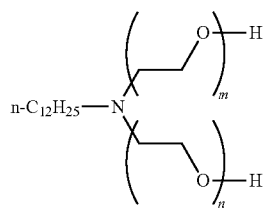

A preferable example of the compound represented by Formula (2) may be as follows. For the following formula, m, n, and l represent positive numbers and m+n+l represents 4 or more.

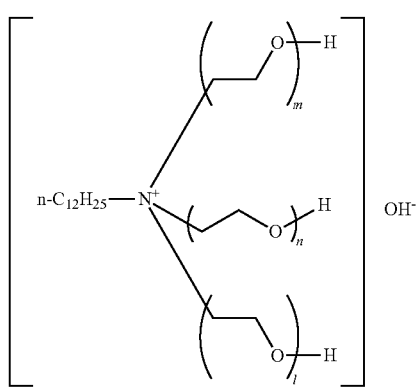

(B) The nitrogen-containing compound described above may be used in combination of a plurality of types. The content of (B) the nitrogen-containing compound in the coating agent is not particularly limited in the range that does not hinder the objects of the present invention. The content of (B) the nitrogen-containing compound in the coating agent is preferably 0.001% by mass to 1% by mass, more preferably 0.01% by mass to 0.8% by mass, and particularly preferably 0.05% by mass to 0.5% by mass with respect to the total liquid amount of the coating agent.

(S) Solvent

The coating agent is generally used as an aqueous solution including (A) the water-soluble polymer and (B) the nitrogen-containing compound as described above. The solid concentration of the coating agent is preferably 0.1 to 30% by mass, more preferably 0.5 to 20% by mass, and most preferably 1 to 10% by mass.

In addition, the coating agent is preferably an aqueous solution, but may include an alcoholic solvent as long as the range of the alcoholic solvent does not damage the effects of the present invention, in addition to water. Examples of the alcoholic solvent may include methyl alcohol, ethyl alcohol, propyl alcohol, isopropyl alcohol, glycerin, ethylene glycol, propylene glycol, 1,2-butylene glycol, 1,3-butylene glycol, 2,3-butylene glycol, and the like. These alcoholic solvents are used in an amount of 30 parts by mass with respect to 100 parts by mass of water, as an upper limit.

(C) Optional Additive

The coating agent for forming a fine pattern may include, if necessary, optional additives such as a water-soluble crosslinking agent, a surfactant, a water-soluble fluorine compound, an amide group-containing monomer, a heterocyclic compound having at least an oxygen atom and/or a nitrogen atom, a heterocyclic compound having at least two or more nitrogen atoms in the same ring, a water-soluble amine compound, and a non-amine-based water-soluble organic solvent, in the range that does not hinder the effects of the present invention. Hereinafter, these additives will be described in order.

Water Soluble Crosslinking Agent

The water soluble crosslinking agent has at least one nitrogen atom in the structure thereof. As such a water soluble crosslinking agent, a nitrogen-containing compound having an amino group and/or imino group in which at least two hydrogen atoms are substituted with a hydroxyalkyl group and/or alkoxyalkyl group is preferably used. Examples of such nitrogen-containing compounds include melamine based derivatives, urea based derivatives, guanamine based derivatives, acetoguanamine based derivatives, benzoguanamine based derivatives and succinyl amide based derivatives in which the hydrogen atom of the amino group is substituted with a methylol group or an alkoxymethyl group or both of these, as well as glycoluril based derivatives and ethylene urea based derivatives in which the hydrogen atom of the imino group is substituted, and the like.

Among these nitrogen-containing compounds, one or more of: triazine-based derivatives such as benzoguanamine-based derivatives, guanamine-based derivatives, and melamine-based derivatives; glycoluril-based derivatives; and urea-based derivatives which have an amino group and/or an imino group in which at least two hydrogen atoms are substituted with a methylol group or a lower alkoxymethyl group having 1 to 6 carbon atoms, or both of these, are preferred in view of the crosslinking reactivity.

In the case when the coating agent for forming a fine pattern includes a water-soluble crosslinking agent, the content of the water-soluble crosslinking agent is preferably 1 to 35% by mass with respect to the solid mass of the coating agent for forming a fine pattern.

Surfactant

As a surfactant, characteristics such as high solubility in (A) the water-soluble polymer, and preclusion of development of suspension in the coating agent, and the like are required. The use of such a surfactant that complies with these characteristics can suppress generation of air bubbles (microfoam), especially when applying the coating formation agent, thereby more effectively enabling prevention of defect generation reportedly related to the microfoam generation. In view of the foregoing aspects, one or more of an N-alkylpyrrolidone-based surfactant, a quaternary ammonium salt-based surfactant, a surfactant based on a phosphoric acid ester of polyoxyethylene, and a nonionic-based surfactant may be preferably used.

As the aforementioned N-alkylpyrrolidone-based surfactant, a compound represented by the following general Formula (C1) is preferred.

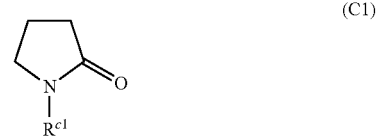

(C1)

In the Formula (C1), $R^{c1}$ represents an alkyl group having 6 or more carbon atoms.

Specific examples of such an N-alkylpyrrolidone-based surfactant include N-hexyl-2-pyrrolidone, N-heptyl-2-pyrrolidone, N-octyl-2-pyrrolidone, N-nonyl-2-pyrrolidone, N-decyl-2-pyrrolidone, N-decyl-2-pyrrolidone, N-undecyl-2-pyrrolidone, N-dodecyl-2-pyrrolidone, N-tridecyl-2-pyrrolidone, N-tetradecyl-2-pyrrolidone, N-pentadecyl-2-pyrrolidone, N-hexadecyl-2-pyrrolidone, N-heptadecyl-2-pyrrolidone, N-octadecyl-2-pyrrolidone, and the like. Among these, N-octyl-2-pyrrolidone ("SURFADONE LP 100"; manufactured by ISP) is preferably used.

As the aforementioned quaternary ammonium-based surfactant, a compound represented by the following Formula (C2) is preferred.

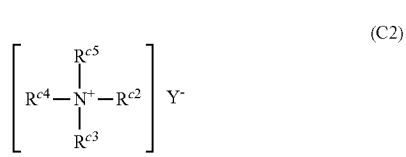
(C2)

In the above Formula (C2), $R^{c2}$, $R^{c3}$, $R^{c4}$, $R^{c5}$ each independently represent an alkyl group or a hydroxyalkyl group (wherein, at least one of them represents an alkyl group or a hydroxyalkyl group having 6 or more carbon atoms), and $X^-$ represents a hydroxide ion or a halogen ion.

Specifically, such quaternary ammonium-based surfactants include dodecyltrimethylammonium hydroxide, tridecyltrimethylammonium hydroxide, tetradecyltrimethylammonium hydroxide, pentadecyltrimethylammonium hydroxide, hexadecyltrimethylammonium hydroxide, heptadecyltrimethylammonium hydroxide, octadecyltrimethylammonium hydroxide, and the like. Among these, hexadecyltrimethylammonium hydroxide is preferably used.

As the aforementioned surfactant based on a phosphoric acid ester of polyoxyethylene, a compound represented by the following Formula (C3) is preferred.

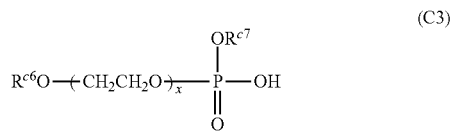
(C3)

In the above Formula (C3), $R^{c6}$ represents an alkyl group or an alkylallyl group having 1 to 10 carbon atoms; $R^{c7}$ represents a hydrogen atom or $(CH_2CH_2O)R^{c6}$ (wherein $R^{c6}$ is as defined above); and x represents an integer of 1 to 20.

Specifically, as such a surfactant based on a phosphoric acid ester of polyoxyethylene, commercially available products such as "Plysurf A212E" and "Plysurf A210G" (both manufactured by Dai-ichi Kogyo Seiyaku Co., Ltd.) can be preferably used.

The aforementioned nonionic surfactant is preferably an alkyl etherified product of polyoxyalkylene, or an alkylamine oxide compound.

As the alkyl etherified product of polyoxyalkylene, a compound represented by the following Formula (C4) or (C5) is preferably used.

(C4)

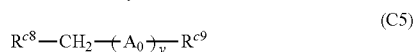
(C5)

In the above Formulae (C4) and (C5), $R^{c8}$ and $R^{c9}$ represent a linear, branched or cyclic alkyl group, an alkyl group having a hydroxyl group, or an alkylphenyl group having 1 to 22 carbon atoms. $A_0$ represents an oxyalkylene group, and is preferably at least one selected from oxyethylene, oxypropylene, and oxybutylene groups. The symbol y represents an integer.

As the alkylamine oxide compound, a compound represented by the following Formula (C6) or (C7) is preferably used.

(C6)

(C7)

In the above Formulae (C6) and (C7), $R^{c10}$ represents an alkyl group or a hydroxyalkyl group having 8 to 20 carbon atoms which may be interrupted with an oxygen atom, and p and q represent an integer of 1 to 5.

Examples of the alkylamine oxide compound represented by the above Formula (C6) or (C7) include octyldimethylamine oxide, dodecyldimethylamine oxide, decyldimethylamine oxide, lauryldimethylamine oxide, cetyldimethylamine oxide, stearyldimethylamine oxide, isohexyldiethylamine oxide, nonyldiethylamine oxide, lauryldiethylamine oxide, isopentadecylmethylethylamine oxide, stearylmethylpropylamine oxide, lauryldi(hydroxyethyl)amine oxide, cetyldiethanolamine oxide, stearyldi(hydroxyethyl)amine oxide, dodecyloxyethoxyethoxyethyldi(methyl)amine oxide, stearyloxyethyldi(methyl)amine oxide, and the like.

Among these surfactants, a nonionic surfactant is preferably used in light of reduction of defects, in particular.

In the case of adding the above-described surfactant, the added amount of the surfactant is preferably 1 ppm by mass to 10% by mass and more preferably 100 ppm by mass to 2% by mass in the solid content of the coating agent.

Water-Soluble Fluorine Compound

As a water-soluble fluorine compound, characteristics such as high solubility in (A) the water-soluble polymer, and preclusion of development of suspension in the coating agent, and the like are required. The use of a water-soluble fluorine compound that complies with such characteristics can improve the leveling property (the extent of the spreading of the coating agent). Although this leveling property can be achieved by lowering of the contact angle by adding an excessive amount of surfactant, when the amount of the surfactant added is in excess, the application improving ability cannot be achieved at a certain level or higher, and furthermore, by adding an excess amount, the air bubbles (microfoam) may be generated on the coat film depending on the application conditions, thereby leading to a problem of potentially causing defects. By combining this water-soluble fluorine compound, the contact angle is lowered while suppressing such foaming, and thus leveling properties can be improved.

As the water soluble fluorine compound, fluoroalkyl alcohols, fluoroalkylcarboxylic acids and the like are preferably used. Examples of the fluoroalkyl alcohols include 2-fluoro-1-ethanol, 2,2-difluoro-1-ethanol, trifluoroethanol, tetrafluoropropanol, octafluoroamyl alcohol, and the like. Examples of the fluoroalkylcarboxylic acids include trifluoroacetic acid, and the like. However, the fluoroalkylcarboxylic acid is not limited to such exemplified compounds, and is acceptable as long as it is a fluorine compound having water solubility, and exhibits the effects described above. In particular, fluoroalkyl alcohols having 6 or less carbon atoms may be preferably used. Among these, in light of ready availability and the like, trifluoroethanol is particularly preferred.

In the case of adding the above-described water-soluble fluorine compound, the added amount of the water-soluble fluorine compound is preferably 0.1 to 30% by mass and more preferably 0.1 to 15% by mass in the solid content of the coating agent.

Amide Group-Containing Monomer

Although the amide group-containing monomer is not particularly limited, characteristics such as excellent compatibility with (A) the water-soluble polymer, and preclusion of development of suspension in the coating agent are required.

As the amide group-containing monomer, the amide compound represented by the following Formula (C8) is preferably used.

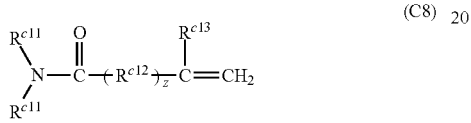
(C8)

In the above Formula (C8), $R^{c11}$ represents a hydrogen atom, an alkyl group having 1 to 5 carbon atoms, or a hydroxyalkyl group; $R^{c12}$ represents an alkyl group having 1 to 5 carbon atoms; $R^{c13}$ represents a hydrogen atom or a methyl group; and z represents an integer of from 0 to 5. In the above, the alkyl group and the hydroxyalkyl group may include both a linear chain and a branched chain.

As the amide group-containing monomer represented by the above Formula (C8), compounds in which $R^{c11}$ represents a hydrogen atom, a methyl group, or an ethyl group; and z represents 0 are more preferably used. Specific examples of the amide group-containing monomer include acrylamide, methacrylamide, N,N-dimethylacrylamide, N,N-dimethylmethacrylamide, N,N-diethylacrylamide, N,N-diethylmethacrylamide, N-methylacrylamide, N-methylmethacrylamide, N-ethylacrylamide, N-ethylmethacrylamide, and the like. Among these, acrylamide, and methacrylamide are particularly preferred.

In the case of adding the amide group-containing monomer, the added amount of the amide group-containing monomer is preferably 0.1 to 30% by mass, and more preferably 1 to 15% by mass in the solid content of the coating agent.

Heterocyclic Compound Having at Least Oxygen Atom and/or Nitrogen Atom

The coating agent may include a heterocyclic compound having at least an oxygen atom and/or nitrogen atom. As the heterocyclic compound, at least one selected from a compound having an oxazolidine skeleton, a compound having an oxazoline skeleton, a compound having an oxazolidone skeleton, and a compound having an oxazolidinone skeleton is preferably used.

Examples of the compound having the oxazolidine skeleton include oxazoline represented by the following formula (C9), as well as substituted products thereof.

(C9)

Examples of the substituted product may include compounds having substitution of a hydrogen atom bound to the carbon atom or nitrogen atom of oxazoline represented by the above Formula (C9), with a substituted or unsubstituted lower alkyl group having 1 to 6 carbon atoms, a carboxyl group, a hydroxyl group, or a halogen group. As the substituted lower alkyl group, a hydroxyalkyl group, a lower alkoxyalkyl group, and the like may be given as examples, but the substituted lower alkyl group is not limited thereto.

Examples of the compound having an oxazoline skeleton include 2-oxazoline represented by the following Formula (C9-1), 3-oxazoline represented by the following Formula (C9-2), and 4-oxazoline represented by the following Formula (C9-3), as well as substituted products thereof.

(C9-1)

(C9-2)

(C9-3)

Examples of the substituted product may include compounds having substitution of a hydrogen atom bound to the carbon atom or nitrogen atom of the compounds having an oxazoline skeleton represented by the above Formulae (C9-1) to (C9-3), with a substituted or unsubstituted lower alkyl group having 1 to 6 carbon atoms, a carboxyl group, a hydroxyl group, or a halogen group. As the substituted lower alkyl group, a hydroxyalkyl group, a lower alkoxyalkyl group, and the like may be given as examples, but the substituted lower alkyl group is not limited thereto.

Among the compounds having an oxazoline skeleton, 2-methyl-2-oxazoline represented by the following Formula (C9-1-A) is preferably used.

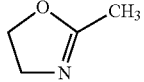
(C9-1-A)

Examples of the compound having an oxazolidone skeleton may include 5(4)-oxazolone represented by the following Formula (C9-4), 5(2)-oxazolone represented by the following Formula (C9-5), 4(5)-oxazolone represented by the following Formula (C9-6), 2(5)-oxazolone represented by the following Formula (C9-7), and 2(3)-oxazolone represented by the following Formula (C9-8), as well as substituted products thereof.

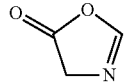
(C9-4)

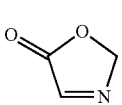
(C9-5)

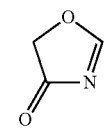
(C9-6)

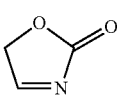
(C9-7)

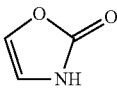
(C9-8)

Examples of the substituted product may include compounds having substitution of a hydrogen atom bound to the carbon atom or nitrogen atom of the compounds having an oxazolidone skeleton represented by the above Formulae (C9-4) to (C9-8), with a substituted or unsubstituted lower alkyl group having 1 to 6 carbon atoms, a carboxyl group, a hydroxyl group, or a halogen group. As the substituted lower alkyl group, a hydroxyalkyl group, a lower alkoxyalkyl group, and the like may be given as examples, but the substituted lower alkyl group is not limited thereto.

Examples of the compound having an oxazolidinone skeleton (or compound having a 2-oxazolidone skeleton) may include oxazolidinone (or 2-oxazolidone) represented by the following Formula (C10), as well as substituted products thereof.

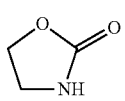
(C10)

Examples of the substituted product may include compounds having substitution of a hydrogen atom bound to the carbon atom or nitrogen atom of oxazolidinone (or 2-oxazolidone) represented by the above Formula (C10), with a substituted or unsubstituted lower alkyl group having 1 to 6 carbon atoms, a carboxyl group, a hydroxyl group, or a halogen group. As the substituted lower alkyl group, a hydroxyalkyl group, a (lower alkoxy)alkyl group, and the like may be given as examples, but the substituted lower alkyl group is not limited thereto.

Among the compounds having an oxazolidinone skeleton, 3-methyl-2-oxazolidone represented by the following Formula (C10-1) is preferably used.

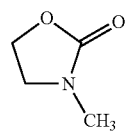
(C10-1)

In the case of adding the heterocyclic compound having at least an oxygen atom and/or a nitrogen atom, the added amount thereof is adjusted to be preferably 1 to 50% by mass, and more preferably 3 to 20% by mass with respect to (A) the water-soluble polymer.

Heterocyclic Compound Having Two or More Nitrogen Atoms in at Least the Same Ring Examples of the heterocyclic compound having two or more nitrogen atoms in at least the same ring may include pyrazole based compounds such as pyrazole, 3,5-dimethylpyrazole, 2-pyrazoline, 5-pyrazolone, 3-methyl-1-phenyl-5-pyrazolone, 2,3-dimethyl-1-phenyl-5-pyrazolone, 2,3-dimethyl-4-dimethylamino-1-phenyl-5-pyrazolone, and benzopyrazole; imidazole based compounds such as imidazole, methylimidazole, 2,4,5-triphenylimidazole, 4-(2-aminoethyl)imidazole, and 2-amino-3-(4-imidazolyl)propionic acid; imidazoline based compounds such as 2-imidazoline, 2,4,5-triphenyl-2-imidazoline, and 2-(1-naphthylmethyl)-2-imidazoline; imidazolidine based compounds such as imidazolidine, 2-imidazolidone, 2,4-imidazolidinedione, 1-methyl-2,4-imidazolidinedione, 5-methyl-2,4-imidazolidinedione, 5-hydroxy-2,4-imidazolidinedione-5-carboxylic acid, 5-ureide-2,4-imidazolidinedione, 2-imino-1-methyl-4-imidazolidone, and 2-thioxo-4-imidazolidone; benzoimidazole based compounds such as benzoimidazole, 2-phenylbenzoimidazole, and 2-benzoimidazolinone; diazine based compounds such as 1,2-diazine, 1,3-diazine, 1,4-diazine, and 2,5-dimethylpyrazine; hydropyrimidine based compounds such as 2,4(1H, 3H)pyrimidinedione, 5-methyluracil, 5-ethyl-5-phenyl-4,6-perhydropyrimidinedione, 2-thioxo-4(1H,3H)-pyrimidinone, 4-imino-2(1H, 3H)-pyrimidine, and 2,4,6(1H,3H,5H)-pyrimidinetrione; benzodiazine based compounds such as cinnoline, phthalazine, quinazoline, quinoxaline, and luminol; dibenzodiazine based compounds such as benzoshinorine, phenazine, and 5,10-dihydrophenazine; triazole based compounds such as 1H-1, 2,3-triazole, 1H-1,2,4-triazole, and 4-amino-1,2,4-triazole; benzotriazole based compounds such as benzotriazole, and 5-methylbenzotriazole; triazine based compounds such as 1,3,5-triazine, 1,3,5-triazine-2,4,6-triol, 2,4,6-trimethoxy-1, 3,5-triazine, 1,3,5-triazine-2,4,6-trithiol, 1,3,5-triazine-2,4, 6-triamine, and 4,6-diamino-1,3,5-triazine-2-ol, and the like, but not limited thereto.

Among these, in light of ease in handling, ready availability and the like, a monomer of an imidazole-based compound is preferably used, and particularly imidazole is preferably used.

In the case of adding the heterocyclic compound having two or more nitrogen atoms in at least the identical ring, the added amount thereof is preferably 1 to 15% by mass, and more preferably 2 to 10% by mass with respect to (A) the water-soluble polymer.

Water-Soluble Amine Compound

By combining such a water-soluble amine compound to the coating agent, also the prevention of the generation of impurities, the adjustment of pH, and the like become possible.

Examples of the water-soluble amine compound may include amines having a pKa (acid dissociation constant) in an aqueous solution at 25° C. of 7.5 to 13, which are not (B) the nitrogen-containing compound.

Specific examples may include alkanolamines such as monoethanolamine, diethanolamine, triethanolamine, 2-(2-aminoethoxy)ethanol, N,N-dimethyl ethanolamine, N,N-diethyl ethanolamine, N,N-dibutylethanolamine, N-methylethanolamine, N-ethylethanolamine, N-butylethanolamine, N-methyldiethanolamine, monoisopropanolamine, diisopropanolamine, and triisopropanolamine; polyalkylenepolyamines such as diethylene triamine, triethylene tetramine, propylenediamine, N,N-diethylethylene diamine, 1,4-butanediamine, N-ethyl-ethylene diamine, 1,2-propane diamine, 1,3-propane diamine, and 1,6-hexanediamine; aliphatic amines such as 2-ethyl-hexylamine, dioctylamine, tributylamine, tripropylamine, triallylamine, heptylamine, and cyclohexylamine; aromatic amines such as benzylamine, and diphenylamine; cyclic amines such as piperazine, N-methyl-piperazine, and hydroxyethylpiperazine, and the like. Among these, amines having a boiling point of no less than 140° C. (at 760 mmHg) are preferred, and for example, monoethanolamine, triethanolamine or the like may be preferably used.

In the case of adding the water-soluble amine compound, the added amount thereof is preferably 0.1 to 30% by mass, and more preferably 2 to 15% by mass in the solid content of the coating formation agent.

Non-Amine-Based Water-Soluble Organic Solvent

In the case when a non-amine-based water-soluble organic solvent is combined with the coating agent, it is easy to suppress generation of defects as defects of the pattern in a fined resist pattern.

Such non-amine-based water-soluble organic solvents may be any solvent so long as it is a water miscible non-amine organic solvent, for example, sulfoxides such as dimethylsulfoxide and the like; sulfones such as dimethylsulfone, diethylsulfone, bis(2-hydroxyethyl)sulfone, tetramethylenesulfone, and the like; amides such as N,N-dimethylformamide, N-methylformamide, N,N-dimethylacetamide, N-methylacetamide, N,N-diethylacetamide, and the like; lactams such as N-methyl-2-pyrrolidone, N-ethyl-2-pyrrolidone, N-propyl-2-pyrrolidone, N-hydroxymethyl-2-pyrrolidone, N-hydroxyethyl-2-pyrrolidone, and the like; imidazolidinones such as 1,3-dimethyl-2-imidazolidinone, 1,3-diethyl-2-imidazolidinone, 1,3-diisopropyl-2-imidazolidinone, and the like; polyhydric alcohols such as ethylene glycol, ethylene glycol monomethyl ether, ethylene glycol monoethyl ether, ethylene glycol monobutyl ether, ethylene glycol monomethyl ether acetate, ethylene glycol monoethyl ether acetate, diethylene glycol, diethylene glycol monomethyl ether, diethylene glycol monoethyl ether, diethylene glycol monobutyl ether, propylene glycol, propylene glycol monomethyl ether, glycerin, 1,2-butylene glycol, 1,3-butylene glycol, and 2,3-butylene glycol, and derivatives thereof. Among these, in light of suppression of the generation of the defect, and the like, polyhydric alcohols and derivatives thereof may be preferably used, and particularly glycerin is preferably used. The non-amine-based water soluble organic solvent may be used alone, or two or more of them may be used.

In the case of adding the non-amine-based water-soluble organic solvent, the added amount thereof is preferably 0.1 to 30% by mass, and more preferably 0.5 to 15% by mass with respect to (A) the water-soluble polymer.

The above-described components are mixed in the desired ratio, and then uniformly dissolved, and thereby, the coating agent for forming a fine pattern according to the present invention can be prepared.

Method for Forming Fine Pattern

Hereinafter, a method for forming a fine pattern using the above-described coating agent will be described. The fine pattern is formed by coating a resist pattern on a substrate with a coat film composed of the above-described coating agent, narrowing down the intervals between the resist patterns by thermal-shrinking the coating agent through a heating treatment, and then removing the coat film.

Fabrication of a substrate having a resist pattern is not particularly limited, but may be performed by using a usual method for fabricating a semiconductor device, a liquid crystal display device, a magnetic head, micro lens, or the like. For example, a chemical amplification-typed photoresist composition is coated on a substrate such as a silicon wafer using a spinner, and then dried to form a photoresist layer. After this, active rays such as ultraviolet rays, deep-UV, and exciplex laser light are irradiated through a desired mask pattern in a vacuum or through the liquid having a predetermined refractive index using a reduction projection exposure device, and the like, or a pattern is drawn by an electron beam, and then the substrate is heated. Next, the development is conducted with a developing solution, for example, an aqueous alkali solution, such as 1 to 10% by mass of an aqueous tetramethyl ammonium hydroxide (TMAH) solution to form the photoresist pattern on the substrate.

In addition, the composition for a photoresist that is a material for a resist pattern in the present invention is not particularly limited, but may be a photoresist composition which is generally and widely used, such as a photoresist composition for i and g rays, a photoresist composition for exciplex laser, such as KrF, ArF, and $F_2$, a photoresist composition for EB (electron beam), and photoresist for EUV.

Next, a coating agent is coated all over the surface of the substrate having a resist pattern to coat the resist pattern with the coat film composed of the coating agent. In addition, after applying the coating agent, the substrate may be subjected to a prebaking at a temperature of from 80 to 100° C. for 30 to 90 seconds.

The coating method may be performed by a generally performed method used for a conventional heat flow process. In other words, the coating agent is applied onto the substrate by a known applying means such as a bar coating method, a roll coating method, a slit coating method, and a rotate coating method using a spinner.

After forming the coat film, the heating treatment is performed to thermally shrink the coat film composed of a coating agent. By the shrinking function of the coat film, the resist pattern in contact with the coat film is expanded and enlarged in width up to the corresponding shrinking amount of the coat film, and thus, the resist patterns are close to each other, and thereby, the intervals between the resist patterns are narrowed down.

The heating treatment temperature is a temperature capable of generating the shrinking of the coat film composed of the coating agent, and is not particularly limited as long as it is sufficient for forming a fine pattern. In addition, it is preferable that the heating be performed at the temperature in which the resist pattern does not generate thermal flowing phenomenon. The temperature in which the resist pattern does not generate thermal flowing phenomenon relates to the temperature at which the coat film composed of a coating agent is not formed, and when a substrate having only a resist pattern is heated, the dimensional change of the resist pattern (for example, a dimensional change by a self-flowing, and the like) does not occur. By performing the heating treatment at such a temperature, it is very effective because a profile can form a favorable fine pattern very effectively, and also especially, the duty rate on a wafer surface, that is, the dependency to pattern intervals on the wafer surface can be reduced. In view of the temperature that starts thermal flowing of various resist compositions used for a current photolithography technique, a preferable heating treatment is generally performed at a temperature range of from 80 to 180° C., but at the temperature at which a photoresist does not generate thermal flowing, for 30 to 90 seconds.

In addition, the thickness of a coat film composed of a coating agent is preferably at the same level as the height of the photoresist pattern or the height level capable of covering the photoresist pattern.

After performing the heating treatment, the coat film composed of the coating-type agent remaining on the substrate having the resist pattern is removed by washing it with a water-based solvent, preferably pure water for 10 to 60 seconds. In addition, before water washing, if desired, it may be rinsed with an aqueous alkali solution (for example, tetramethyl ammonium hydroxide (TMAH), choline, and the like). The coating formation agent according to the present invention can be easily washed and removed by water, and also can be completely removed from the substrate and the resist pattern.

Through the above process, the substrate having a fine pattern defined between resist patterns having an enlarged and expanded width can be obtained. In addition, the above-described process may be repeatedly performed until a resist pattern is fined to be at the desired level.

By the above-described method, a favorable fine pattern having a suppressed deviation of CD can be formed by fine-fabricating a resist pattern using the above-described coating agent including (B) a specific nitrogen-containing compound.

EXAMPLES

Hereinafter, the present invention is explained in more detail by way of Examples, but the present invention is not in any way limited to these Examples.

Example 1 and Comparative Examples 1 to 8

2 parts by mass of polyvinyl alcohol, 0.3 parts by mass of a nitrogen-containing compound that is a type disclosed in Table 1, and 0.02 parts by mass of an nonionic surfactant (PLYSURF A210G manufactured by DAI-ICHI KOGYO SEIYAKU CO., LTD.) were dissolved in ion-exchanged distilled water (97.68 parts by mass) to prepare a coating agent.

In Example 1, Compound 1 (a tertiary amine compound) represented by the following formula was used as the nitrogen-containing compound.

Compound 1:

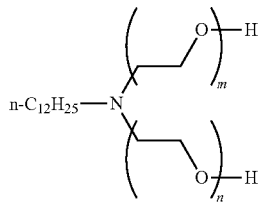

(In the above formula, the sum of m and n represents 7 on average.)

In Comparative Examples 2 to 9, the following Comparative Compounds 1 to 8 were used as the nitrogen-containing compound.

Comparative Compound 1: tetramethyl ammonium hydroxide
Comparative Compound 2: N-methyl ethanol amine
Comparative Compound 3: triethyl amine
Comparative Compound 4: diethylene triamine
Comparative Compound 5: 2-(2-aminoethyl amino)ethanol
Comparative Compound 6: ethanol amine
Comparative Compound 7: tetrahydrofuran-2-methanamine
Comparative Compound 8: triethanol amine (Evaluation)

A coating solution for forming an antireflection film (ARC-29A manufactured by Brewer Science, Inc.) was applied onto an 8-inch silicon wafer, and then subjected to a heating treatment at 205° C. for 60 seconds, whereby an antireflection film having a film thickness of 85 nm was formed. ArF resist (TARF-P6619 manufactured by TOKYO OHKA KOGYO CO., LTD.) was applied onto the antireflection film using a spinner, and then subjected to a heating treatment at 115° C. for 60 seconds, whereby a resist film having a film thickness of 150 nm was formed. The resist film formed as described above was exposed using an exposure device (Nikon NSR-S308F manufactured by Nikon Corporation) through a halftone mask pattern with a contact hole (CH) diameter of 90 nm, and then, subjected to a heating treatment at 115° C. for 60 seconds. Subsequently, a development treatment was carried out using a 2.38% by mass solution of aqueous tetramethyl ammonium hydroxide (TMAH) to obtain a hole pattern.

The coating agent prepared from each of Examples and Comparative Examples was applied onto the surface of the substrate having a hole pattern to be a coat film having a film thickness of 50 nm, whereby the surface of the hole pattern was coated with a coat film composed of a coating agent. Subsequently, the hole pattern coated with the coating agent was subjected to a heating treatment at 130° C. for 60 seconds, whereby the hole pattern was subjected to the fining-treatment. Next, the coating agent was removed using pure water at 23° C. With the pattern subjected to the fining-treatment and formed as described above, the following evaluations were carried out.

For a non-treated pattern and a pattern subjected to the fining-treatment, one field of vision including 16 contact holes on the upper side was observed with a length measuring SEM (a scanning electron microscope, Trade name: CG4100 manufactured by Hitachi High-Technologies Corp.). SEM images including 16 contact holes for a total of 6 fields of vision were obtained. From the obtained SEM images, CD corresponding to the diameter of each of the holes, the shrinking amount of the pattern (hole) subjected to the fining-treatment, CDU (nm), which is the index of the in-plane uniformity of the diameter of the hole, and the circularity of the hole were obtained.

The average value obtained from the CDs of 96 holes was used as the CD value of a non-treated pattern or a pattern subjected to the fining-treatment. The shrinking amount of the pattern was obtained by dividing the CD value of the pattern subjected to the fining-treatment by the CD value of the non-treated pattern. The three times value ($3\sigma$) of the standard deviation ($\sigma$) was obtained from the CDs of 96 holes as the value (nm) of CDU (in-plane uniformity of a pattern dimension).

The circularity of the hole was obtained as follows. First, the distance from a centerline to the edging around the hole for each of the holes was obtained for 24 directions from the center of each of the holes. The three times value ($3\sigma$) of the standard deviation ($\sigma$) was obtained from the distance data of the 24 directions obtained from 96 holes as a value (nm) of the circularity of the hole. This means that as the value of $3\sigma$ obtained as described above is low, the circularity of the hole is high.

TABLE 1

|  | Nitrogen-containing compound | CD of hole (nm) | Shrinking amount (nm) | CDU (nm) | Circularity (nm) |
|---|---|---|---|---|---|
| Non-treated pattern | — | 90.9 | — | 8.0 | 5.0 |
| Example 1 | Compound 1 | 81.5 | 9.4 | 5.4 | 2.6 |
| Comparative example 1 | Comparative compound 1 | 94.6 | −3.7 | 6.1 | 4.5 |
| Comparative example 2 | Comparative compound 2 | 92.8 | −1.9 | 6.5 | 4.8 |
| Comparative example 3 | Comparative compound 3 | 92.5 | −1.6 | 7.1 | 4.8 |
| Comparative example 4 | Comparative compound 4 | 88.5 | 2.4 | 6.5 | 4.7 |
| Comparative example 5 | Comparative compound 5 | 90.1 | 0.8 | 8.3 | 4.6 |
| Comparative example 6 | Comparative compound 6 | 91.2 | −0.3 | 6.5 | 4.7 |
| Comparative example 7 | Comparative compound 7 | 92.7 | −1.8 | 7.2 | 4.8 |
| Comparative example 8 | Comparative compound 8 | 91.9 | −1.0 | 7.3 | 4.0 |

According to Table 1, it can be confirmed that when a pattern is treated with the coating agent of Example 1, including Compound 1, which is a nitrogen-containing compound that has an alkyl group having 8 or more carbon atoms bound to a nitrogen atom and is combined with 4 moles or more of ethylene oxide and/or propylene oxide with respect to one mole of nitrogen atoms bound with an alkyl group, a pattern can be favorably fined and also CDU is significantly decreased. Meanwhile, according to Comparative Examples 1 to 8, it can be confirmed that even when a pattern is treated with a coating agent that is combined with various amines included in a predetermined structure as a nitrogen-containing compound, it is difficult to fine-fabricate a pattern and CDU is not decreased.

Confirmation of relationship between exposure amount and CD and relationship between CD and CDU A hole pattern was formed in the same method as the above-described method except that the exposure amount was changed by 1 mJ/cm$^2$ within the range of from 37 to 52 mJ/cm$^2$. For the hole patterns formed by each of the exposure amounts, fine-fabrication was carried out in the same method as the above-described method using the coating agent of each of Example 1 and Comparative Examples 1 to 8. The CD and CDU of the hole of the hole pattern without being treated with the coating agent and the CD and CDU of the hole of the hole pattern subjected to fining treatment with the coating agent of each of Example 1 and Comparative Examples 1 to 8 were measured per each exposure amount. In addition, the case of being not treated with the coating agent was used as Reference Example.

Figure 2:
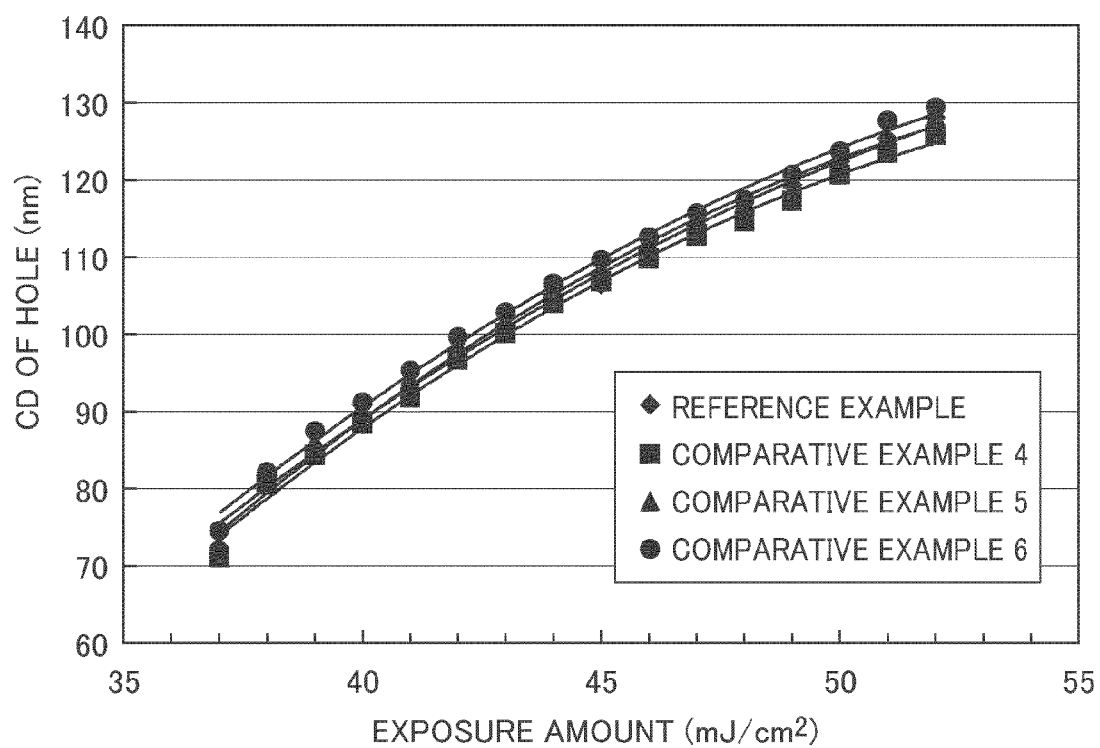
FIG. 2 shows a graph illustrating the relationship between the exposure amount and the CD of a hole in case of treating a hole pattern using the coating agents of Reference Example and Comparative Examples 4 to 6.
Figure 3:
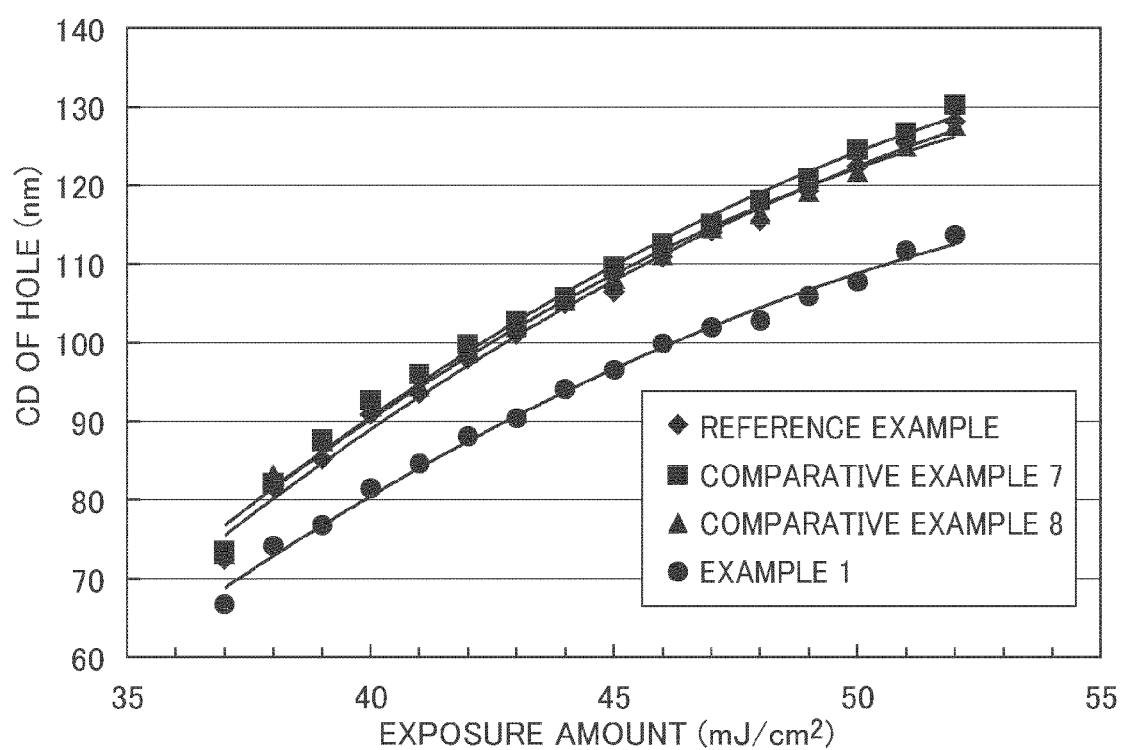
FIG. 3 shows a graph illustrating the relationship between the exposure amount and the CD of a hole in case of treating a hole pattern using the coating agents of Reference Example, Comparative Examples 7 and 8, and Example 1.

The graphs representing the relationship between the exposure amount and the CD of the hole in Reference Example and the relationships between the exposure amount and the CD of the hole in the cases when the hole patterns were treated with the coating agents of Example 1 and Comparative Examples 1 to 8 are illustrated in FIGS. 1 to 3.

In the cases when the hole patterns were treated with the coating agents of Reference Example, Example 1, and Comparative Examples 1 to 8, the values of CD and CDU measured per each exposure amount are plotted on the plane with CD as the horizontal axis and CDU as the vertical axis. The graphs representing the relationships between the CDs and CDUs for Reference Example, Example 1, and Comparative Examples 1 to 8 are illustrated in FIGS. 4 to 6.

According to FIGS. 1 to 3, it can be confirmed that the CDs of the holes treated with the coating agents of Comparative Examples 1 to 8 are increased according to the increase of the exposure amount at a similar ratio to the CD of the holes of the non-treated holes. Meanwhile, according to FIG. 3, it can be confirmed that the CD of the hole treated with the coating agent of Example 1 is not increased even when the exposure amount is increased, as compared to the CD of the hole of Reference Example.

This means that in the case when the pattern is treated with the coating agent of Example 1 including Compound 1 as a nitrogen-containing compound, the deviation of the CD of the pattern before fining-treatment, generated by the deviation of the exposure amount when forming a pattern, is reduced by fining-treatment using the coating agent.

Figure 4:
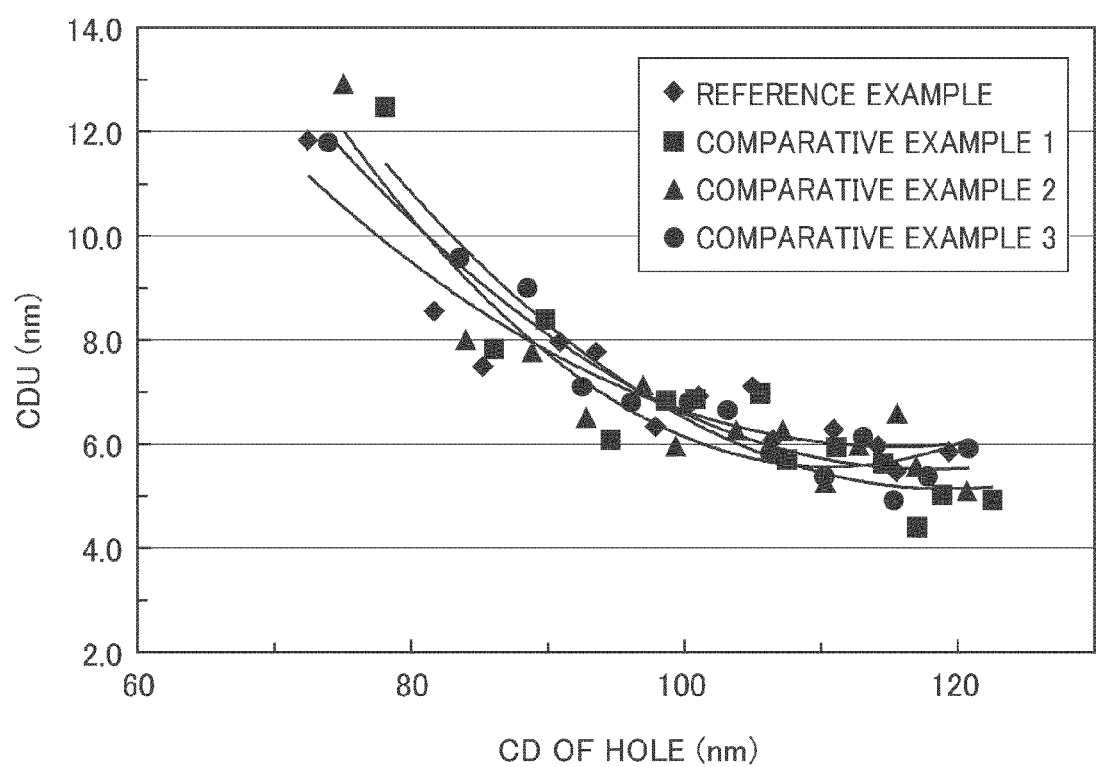
FIG. 4 shows a graph illustrating the relationship between the CD and the CDU of a hole in case of treating a hole pattern using the coating agents of Reference Example and Comparative Examples 1 to 3.
Figure 5:
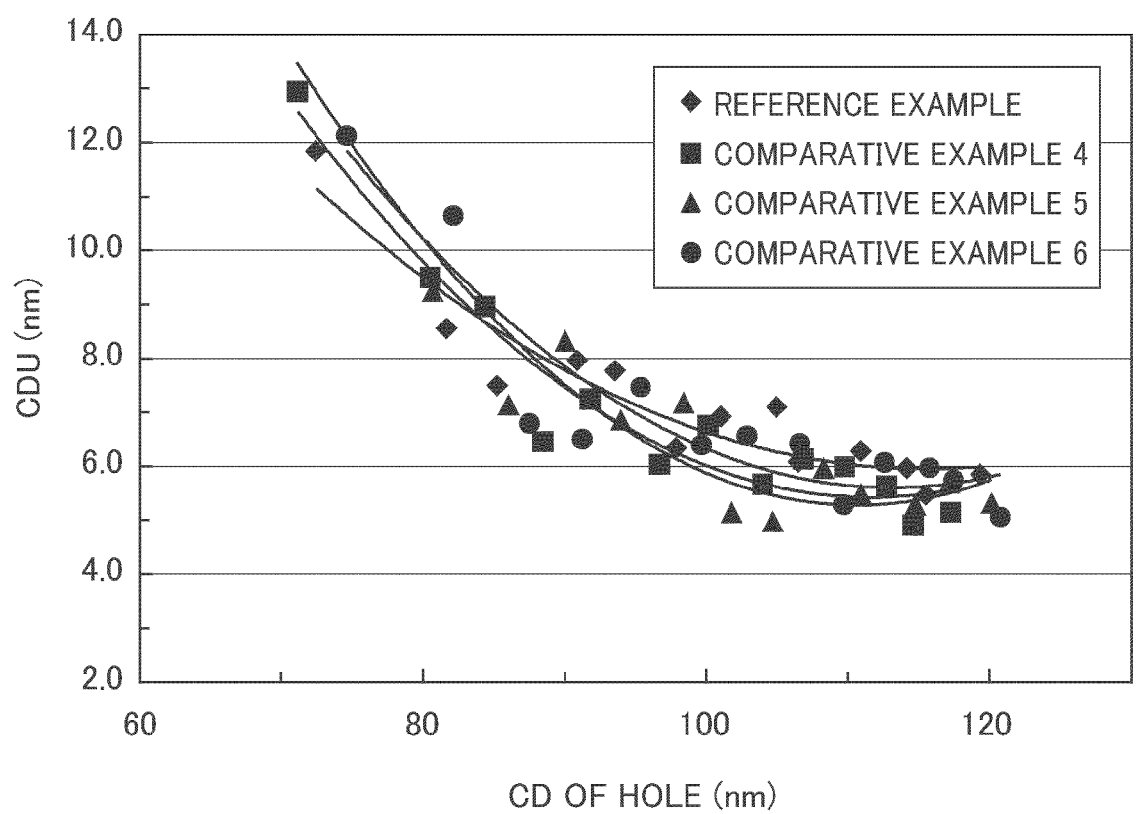
FIG. 5 shows a graph illustrating the relationship between the CD and the CDU of a hole in case of treating a hole pattern using the coating agents of Reference Example and Comparative Examples 4 to 6.
Figure 6:
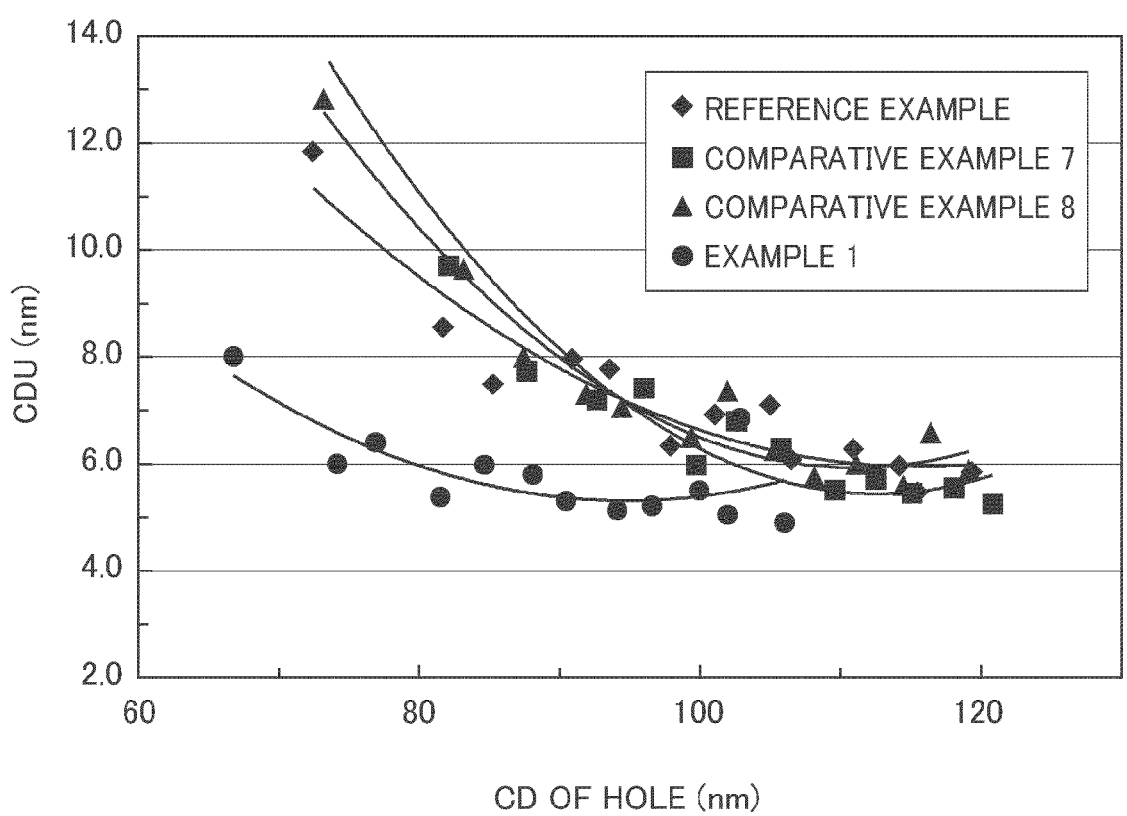
FIG. 6 shows a graph illustrating the relationship between the CD and the CDU of a hole in case of treating a hole pattern using the coating agents of Reference Example, Comparative Examples 7 and 8, and Example 1.

According to FIGS. 4 to 6, it can be confirmed that the CDUs of the hole patterns treated with the coating agents of Comparative Examples 1 to 8 are similar to the CDU of the hole pattern of Reference Example without being treated with the coating agent regardless of the degree of CD. Meanwhile, according to FIG. 6, it can be confirmed that the CDU of the hole pattern treated with the coating agent of Example 1 is lower than the CDU of the hole pattern of Reference Example without being treated with the coating agent regardless of the degree of CD. In other words, according to the coating agent of Example 1, the deviation of CD for the pattern before fining-treatment, which is generated by the deviation of the exposure amount, is reduced by treating it with the coating agent.

Examples 2 and 3

The coating agent of Example 2 was obtained in the same method as Example 1, except that the amount of the nitrogen-containing compound used is changed to ⅓ of the amount of the nitrogen-containing compound used in Example 1. The coating agent of Example 3 was obtained in the same method as Example 1, except that the amount of the nitrogen-containing compound used is changed to ⅔ of the amount of the nitrogen-containing compound used in Example 1. In addition, for Examples 2 and 3, the amount of the coating agent obtained was to be 100 parts by mass by adjusting the amount of ion-exchanged distilled water used. The hole patterns were subjected to the fining-treatment in the same method as Example 1 using the coating agents of Examples 2 and 3, and the fined patterns were evaluated in the same method as Example 1. The evaluation results are listed in Table 2.

TABLE 2

|  | Amount of nitrogen-containing compound used (Parts by mass) | Shrinking amount (nm) | CDU (nm) | Circularity (nm) |
|---|---|---|---|---|
| Non-treated pattern | — | — | 8.0 | 5.0 |
| Example 2 | 0.1 | 1.0 | 5.5 | 2.2 |
| Example 3 | 0.2 | 5.7 | 5.5 | 2.3 |
| Example 1 | 0.3 | 9.4 | 5.4 | 2.6 |

According to Table 2, it can be confirmed that even in the case of decreasing the content of the nitrogen-containing compound in the coating agent the pattern can be fined. In addition, it can be confirmed that regardless of the content of the nitrogen-containing compound in the coating agent in Table 2, the deviation of CD in the pattern is reduced, and thereby, the hole shapes in the hole patterns are close to a perfect circle.

Examples 4 to 6

The coating agent of Example 4 was obtained in the same method as Example 1, except that Compound 2 (a tertiary amine compound) represented by the following formula, which has a high addition number of ethylene oxide as compared to Compound 1, was used instead of the above described Compound 1 (a tertiary amine compound) as the nitrogen-containing compound. The coating agent of Example 5 was obtained in the same method as Example 4, except that the amount of the nitrogen-containing compound used is changed to ⅓ of the amount of the nitrogen-containing compound used in Example 4. The coating agent of Example 6 was obtained in the same method as Example 4, except that the amount of the nitrogen-containing compound used is changed to ⅔ of the amount of the nitrogen-containing compound used in Example 4. In addition, for Examples 5 and 6, the amount of the coating agent obtained was to be 100 parts by mass by adjusting the amount of ion-exchanged distilled water used. The hole patterns were subjected to the fining-treatment in the same method as Example 1 using the coating agents of Examples 4 to 6, and the fined patterns were evaluated in the same method as Example 1. The evaluation results are listed in Table 3.

Compound 2:

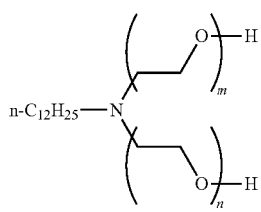

(In the above formula, the sum of m and n represents 10 on average.)

TABLE 3

| | Nitrogen-containing compound | | | |
| --- | --- | --- | --- | --- |
| | Type | Amount used (Parts by mass) | Shrinking amount (nm) | CDU (nm) | Circularity (nm) |
| Non-treated pattern | — | — | — | 8.0 | 5.0 |
| Example 1 | Compound 1 | 0.3 | 9.4 | 5.4 | 2.6 |
| Example 4 | Compound 2 | 0.3 | 10.6 | 5.4 | 2.7 |
| Example 5 | Compound 2 | 0.1 | 0.4 | 5.7 | 2.3 |
| Example 6 | Compound 2 | 0.2 | 6.0 | 6.6 | 2.3 |

According to the comparison of Example 1 and Examples 4 to 6, it can be confirmed that even when the addition number of ethylene oxide with respect to the nitrogen atom of the tertiary amine compound used as the nitrogen-containing compound is increased, the patterns can be fined, the deviations of CDs for the patterns can be reduced, and the hole shapes in the hole patterns are close to a perfect circle.

Examples 7 to 9

The coating agent of Example 7 was obtained in the same method as Example 1, except that Compound 3 (a tertiary amine compound) represented by the following formula, which has a high addition number of ethylene oxide as compared to Compound 2, was used instead of the above described Compound 1 (a tertiary amine compound) as the nitrogen-containing compound. The coating agent of Example 8 was obtained in the same method as Example 7, except that the amount of the nitrogen-containing compound used is changed to ⅓ of the amount of the nitrogen-containing compound used in Example 7. The coating agent of Example 9 was obtained in the same method as Example 7, except that the amount of the nitrogen-containing compound used is changed to ⅔ of the amount of the nitrogen-containing compound used in Example 7. In addition, for Examples 8 and 9, the amount of the coating agent obtained was to be 100 parts by mass by adjusting the amount of ion-exchanged distilled water used. The hole patterns were subjected to the fining-treatment in the same method as Example 1 using the coating agents of Examples 7 to 9, and the fined patterns were evaluated in the same method as Example 1. The evaluation results are listed in Table 4.

Compound 3:

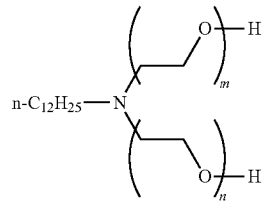

(In the above formula, the sum of m and n represents 20 on average.)

TABLE 4

| | Nitrogen-containing compound | | | |
| --- | --- | --- | --- | --- |
| | Type | Amount used (Parts by mass) | Shrinking amount (nm) | CDU (nm) | Circularity (nm) |
| Non-treated pattern | — | — | — | 8.0 | 5.0 |
| Example 1 | Compound 1 | 0.3 | 9.4 | 5.4 | 2.6 |
| Example 4 | Compound 2 | 0.3 | 10.6 | 5.4 | 2.7 |
| Example 7 | Compound 3 | 0.3 | 11.0 | 6.9 | 2.6 |
| Example 8 | Compound 3 | 0.1 | 1.5 | 6.6 | 2.3 |
| Example 9 | Compound 3 | 0.2 | 5.8 | 5.8 | 2.2 |

According to the comparison of Examples 1 and 4, and Examples 7 to 9, it can be confirmed that, even when the addition number of ethylene oxide with respect to the nitrogen atom of the tertiary amine compound used as the nitrogen-containing compound is increased, the patterns can be fined, the deviations of CDs for the patterns can be reduced, and the hole shapes in the hole patterns are close to a perfect circle. In addition, according to the comparison of Examples 1 and 4 and Example 7, it can be confirmed that, as the addition number of ethylene oxide to the nitrogen atom of the tertiary amine compound used as the nitrogen-containing compound is increased, the shrinking amount of the pattern is increased.

Example 10

The coating agent of Example 10 was obtained in the same method as Example 2, except that Compound 4 (a tertiary amine compound) represented by the following formula, which has a lower addition number of ethylene oxide as compared to Compound 1, was used instead of the above described Compound 1 (a tertiary amine compound) as the nitrogen-containing compound. The hole pattern was subjected to the fining-treatment in the same method as Example 1 using the coating agent of Example 10, and the fined pattern was evaluated in the same method as Example 1. The evaluation results are listed in Table 5.

Compound 4:

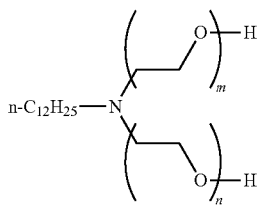

(In the above formula, the sum of m and n represents 4 on average.)

TABLE 5

| | Nitrogen-containing compound | | | |
|---|---|---|---|---|
| | Type | Amount used (Parts by mass) | Shrinking amount (nm) | CDU (nm) | Circularity (nm) |
| Non-treated pattern | — | — | — | 8.0 | 5.0 |
| Example 2 | Compound 1 | 0.1 | 1.0 | 5.5 | 2.2 |
| Example 10 | Compound 4 | 0.1 | 6.8 | 5.9 | 2.3 |

According to Table 5, it can be confirmed that in the case when the coating formation agent includes a nitrogen-containing compound having a predetermined structure, even when the addition number of ethylene oxide is 4 moles (Compound 4) or 7 moles (Compound 1) with respect to 1 mole of the nitrogen atom of the nitrogen-containing compound, the pattern can be favorably fined, the deviation of CD can be reduced, and the hole shape in the hole pattern can be close to a perfect circle.

Examples 11 to 13 and Comparative Examples 9 and 10

The coating agent of Example 11 was obtained in the same method as Example 1, except that Compound 5 (a quaternary ammonium salt) represented by the following formula, was used instead of the above described Compound 1 (a tertiary amine compound) as the nitrogen-containing compound. The coating agent of Example 12 was obtained in the same method as Example 11, except that the amount of the nitrogen-containing compound used is changed to ⅓ of the amount of the nitrogen-containing compound used in Example 11. The coating agent of Example 13 was obtained in the same method as Example 11, except that the amount of the nitrogen-containing compound used is changed to ⅔ of the amount of the nitrogen-containing compound used in Example 11.

Compound 5:

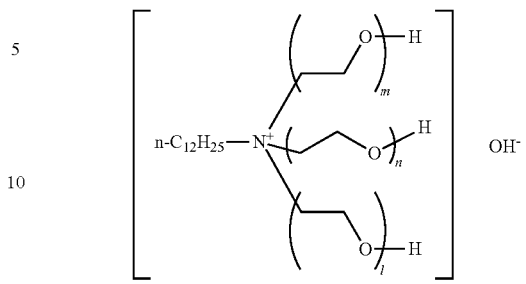

(In the above formula, the sum of m, n and l represents 7 on average.)

The coating agent of Comparative Example 9 was obtained in the same method as Example 1, except that Comparative Compound 9 (cetyltrimethyl ammonium hydroxide) was used instead of the above described Compound 1 (a tertiary amine compound) as the nitrogen-containing compound. The coating agent of Comparative Example 10 was obtained in the same method as Comparative Example 9, except that the amount of the nitrogen-containing compound used is changed to ⅓ of the amount of the nitrogen-containing compound used in Comparative Example 9. The coating agent of Comparative Example 11 was obtained in the same method as Comparative Example 9, except that the amount of the nitrogen-containing compound used is changed to ⅔ of the amount of the nitrogen-containing compound used in Comparative Example 9. In addition, for Examples 12 and 13, and Comparative Example 10, the amount of the coating agent obtained was to be 100 parts by mass by adjusting the amount of ion-exchanged distilled water used.

The hole patterns were subjected to the fining-treatment in the same method as Example 1 using the coating agents of Examples 11 to 13 and Comparative Examples 9 to 11, and the fined patterns were evaluated in the same method as Example 1. The evaluation results are listed in Table 6.

TABLE 6

| | Nitrogen-containing compound | | | |
|---|---|---|---|---|
| | Type | Amount used (Parts by mass) | Shrinking amount (nm) | CDU (nm) | Circularity (nm) |
| Non-treated pattern | — | — | — | 8.0 | 5.0 |
| Example 1 | Compound 1 | 0.3 | 9.4 | 5.4 | 2.6 |
| Example 11 | Compound 4 | 0.3 | 9.0 | 6.2 | 2.6 |
| Example 12 | Compound 4 | 0.1 | 1.3 | 6.4 | 2.3 |
| Example 13 | Compound 4 | 0.2 | 6.3 | 5.7 | 2.4 |
| Comparative example 9 | Comparative compound 9 | 0.3 | −2.8 | 6.1 | 3.4 |
| Comparative example 10 | Comparative compound 9 | 0.1 | 3.5 | 7.8 | 3.5 |

According to the comparison of Example 1 and Example 11, it can be confirmed that in the case of using the coating agent including a nitrogen-containing compound in which a long-chain alkyl group having a predetermined chain length bound to a nitrogen atom is included and a predetermined amount of ethylene oxide is added to a nitrogen atom, even when the nitrogen-containing compound is an amine compound or a quaternary ammonium salt, the pattern can be favorably fined, and the deviation of CD in the pattern can be reduced. Meanwhile, according to Comparative Examples 9 and 10, it can be confirmed that in the case of using the coating agent including a quaternary ammonium salt as the nitrogen-containing compound in which a long-chain alkyl group bound to a nitrogen atom is included but a predetermined amount of ethylene oxide is not added to the nitrogen atom, both the fine-fabrication of the pattern and the decrease of the deviation of CD in the pattern cannot be realized.

What is claimed is:

1. A coating agent for forming a fine pattern, wherein the coating agent is used for coating a resist pattern formed on a substrate and forming a fine pattern,
wherein the coating agent includes (A) a water-soluble polymer and (B) a nitrogen-containing compound, wherein (B) the nitrogen-containing compound has an alkyl group having 8 or more carbon atoms bound to a nitrogen atom and is combined with 4 moles or more of ethylene oxide and/or propylene oxide with respect to 1 mole of the nitrogen atom bound with the alkyl group.

2. The coating agent for forming a fine pattern according to claim 1, wherein (B) the nitrogen-containing compound is represented by the following Formula (1) or the following Formula (2):

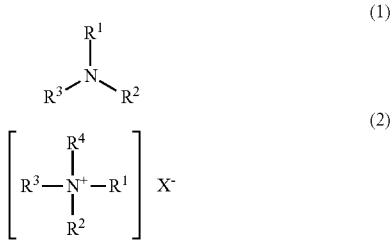

wherein in Formula (1), $R^1$ represents an alkyl group having 8 or more carbon atoms, $R^2$ represents a group represented by $-(A-O)_q-R^5$, and $R^3$ represents a hydrogen atom, an alkyl group, a hydroxyalkyl group, or a group represented by $-(A-O)_r-R^5$, wherein A represents an ethylene group or a propylene group, $R^5$ represents a hydrogen atom or an alkyl group, q represents a positive number, r represents 0 or a positive number, and q+r represents 4 or more, wherein in Formula (2), $R^1$ represents an alkyl group having 8 or more carbon atoms, $R^2$ represents a group represented by $-(A-O)_q-R^5$, $R^3$ represents an alkyl group, a hydroxyalkyl group, or a group represented by $-(A-O)_r-R^5$, $R^4$ represents an alkyl group, a hydroxyalkyl group, or a group represented by $-(A-O)_s-R^5$, and $X^-$ represents a monovalent anion, and wherein A represents an ethylene group or a propylene group, $R^5$ represents a hydrogen atom or an alkyl group, q represents a positive number, r and s each represent 0 or a positive number, and q+r+s represents 4 or more.

3. The coating agent for forming a fine pattern according to claim 2, wherein in the above Formula (1), $R^3$ represents a group represented by $-(A-O)_r-H$.

4. The coating agent for forming a fine pattern according to claim 2, wherein in the above Formula (2), $R^3$ represents a group represented by $-(A-O)_r-H$, and $R^4$ represents a group represented by $-(A-O)_s-H$.

5. A method for forming a fine pattern, comprising:
coating a resist pattern on a substrate with a coat film composed of the coating agent for forming a fine pattern according to claim 1;
narrowing down the intervals between the resist patterns by thermal-shrinking the coating agent for forming a fine pattern through a heating treatment; and then removing the coat film.

6. The coating agent for forming a fine pattern according to claim 2, wherein the nitrogen-containing compound is represented by Formula (1), in which $R^2$ represents $-(CH_2CH_2-O)_q-H$, $R^3$ represents $-(CH_2CH_2-O)_r-H$, q represents a positive number, r represents a positive number, and q+r represents 4 or more.

7. The coating agent for forming a fine pattern according to claim 2, wherein the nitrogen-containing compound is represented by Formula (2), in which $R^2$ represents $-(CH_2CH_2-O)_q-H$, $R^3$ represents $-(CH_2CH_2-O)_r-H$, $R^4$ represents $-(CH_2CH_2-O)_s-H$, wherein q represents a positive number, r represents a positive number, s represents a positive number, and q+r+s represents 4 or more.

* * * * *